(12) United States Patent
Hashimoto

(10) Patent No.: US 6,972,474 B2
(45) Date of Patent: Dec. 6, 2005

(54) SEMICONDUCTOR DEVICE HAVING A FUSE AND A LOW HEAT CONDUCTIVE SECTION FOR BLOWOUT OF FUSE

(75) Inventor: Shingo Hashimoto, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 21 days.

(21) Appl. No.: 11/009,358

(22) Filed: Dec. 10, 2004

(65) Prior Publication Data

US 2005/0116315 A1 Jun. 2, 2005

Related U.S. Application Data

(63) Continuation of application No. 10/780,315, filed on Feb. 17, 2004, now abandoned, which is a continuation of application No. 10/136,980, filed on May 1, 2002, now abandoned.

(30) Foreign Application Priority Data

May 24, 2001 (JP) .............................. 2001-155297

(51) Int. Cl.$^7$ .............................................. H01L 29/00
(52) U.S. Cl. ..................... 257/529; 257/530; 257/209; 438/132; 438/215
(58) Field of Search ............................... 257/529, 530, 257/209; 438/131, 132, 601, 215, 281, 333, 438/467

(56) References Cited

U.S. PATENT DOCUMENTS

| 4,032,949 A | * | 6/1977 | Bierig ........................ 257/529 |
| 4,267,633 A | | 5/1981 | Seiler |
| 5,469,981 A | | 11/1995 | Srikrishnan et al. |
| 5,585,663 A | | 12/1996 | Bezama et al. |
| 6,372,554 B1 | | 4/2002 | Kawakita et al. |
| 2002/0014680 A1 | | 2/2002 | Tottori |
| 2002/0063305 A1 | | 5/2002 | Koike |

FOREIGN PATENT DOCUMENTS

| JP | 61-110447 | 5/1986 |
| JP | 08-046050 | 2/1996 |
| JP | 2000-182393 | 6/2000 |
| WO | 01/88981 | 11/2001 |

* cited by examiner

*Primary Examiner*—David Nelms
*Assistant Examiner*—Long Tran
(74) *Attorney, Agent, or Firm*—Katten Muchin Rosenman LLP

(57) ABSTRACT

In a semiconductor device having a fuse 11 which makes connection between a first interconnection 10 and a second interconnection 12, and a first low heat-conductive section 13 which makes connection between the first interconnection 10 and a third interconnection 14 at a site of the first interconnection 10 where the fuse 11 is not connected, the first low heat-conductive section 13 is fabricated from a material having a heat conductivity lower than that of the material to form the first interconnection 10. When the fuse is blown with the laser beam irradiation, the heat dissipation through the heat conduction along the fuse and the interconnection is to be suppressed, and thereby a satisfactory disconnection at the fuse is to be achieved.

7 Claims, 14 Drawing Sheets

(a)

(b)

(a)

(b)

(c)

(a)

(b)

(a)

(b)

(a)

(b)

(c)

SEMICONDUCTOR DEVICE HAVING A FUSE AND A LOW HEAT CONDUCTIVE SECTION FOR BLOWOUT OF FUSE

CROSS-REFERENCE TO RELATED APPLICATION

This application is a continuation of application Ser. No. 10/780,315, filed on Feb. 17, 2004, abandoned, which is a continuation of application Ser. No. 10/136,980, filed on May 1, 2002, abandoned, both of which applications are hereby incorporated herein by reference.

BACKGROUND OF THE INVENTION

The present invention relates to a fuse for altering the circuit network in a semiconductor device.

The semiconductor device, in general, comprises the test cell for checking the quality of the chips as well as the redundancy cells for replacing faulty cells, if found. The connection and disconnection of the test cell and the redundancy cells are made through disconnection at the fuse(s) which are formed in the semiconductor device, altering the circuit network therein. The disconnection at a fuse (referred to as the blowout of a fuse, hereinafter) is carried out by applying a laser beam onto the fuse or the vicinity of the fuse.

FIG. 12(a) shows one example of a fuse (referred to as a through-hole type fuse or a vertical type fuse, hereinafter) formed within a through hole which runs through an interlayer insulating film. The detailed description of the through-hole type fuse can be found, for example, in Japanese Patent Application Laid-open No. 182393/2000.

In FIG. 12(a), the vertical type fuse 121, which is disposed so as to make connection between an interconnection lying in the second interconnection layer 118 and an interconnection lying in the third interconnection layer 119, is formed by filling up, with a buried material, a through hole which is formed to run through the interlayer insulating film placed between the second interconnection layer 118 and the third interconnection layer 119. The vertical type fuse 121 is formed concurrently with via plugs and the likes, and a material comprising essentially W or such is employed as the buried material. The blowout of such a vertical type fuse 121 is carried out by applying a laser beam L from the upper layer side onto the contact site of the upper layer interconnection for the fuse.

Nevertheless, when a conventional through-hole type fuse is to be blown by a laser beam, the heat supplied by the laser beam may become insufficient due to the heat dissipation, with some of the heat being conducted along the interconnection(s), so that the complete blowout of the fuse may not be achieved.

For example, in the case of a vertical type fuse 121 which makes connection between an upper layer interconnection 124 and a lower layer interconnection 122 as shown in FIG. 12(b), a laser beam L is applied to the upper layer side of the contact site of the upper layer interconnection 124 for the fuse. In this case, the heat E is to be transmitted to the fuse 121 by the conduction through the upper layer interconnection 124, and thereby the fuse is blown.

However, although a part of the heat E is certainly conducted to the fuse, the other part may dissipate, being conducted along the upper layer interconnection 124, as indicated by a wavy line in the drawing. Consequently, the heat to blow the fuse may become insufficient and, in some cases, a fuse residue 123 becomes liable to remain, as shown in FIG. 12(c), and the disconnection, faulty. Moreover, although the value of resistance for this fuse residue is several ten times—one hundred times as much as the value of resistance for the original fuse prior to the laser beam irradiation, it may be still insufficient to activate the test cell or the redundancy cells.

The faulty disconnection of this sort is apt to happen particularly when the interconnection is formed from the material with a high heat conductivity such as Al or Cu, since such an interconnection makes the heat conduct very rapidly to the dissipation.

Meanwhile, also in the case of a fuse (referred to as a buried-trench fuse or a horizontal type fuse, hereinafter) which is formed, as shown in FIG. 13(a), within a recess section or a trench in an interlayer insulating film, there are occasions on which the faulty disconnection occurs because of thermal dissipation, although not so often as in the case of the through-hole type fuse. The detailed description of the buried-trench fuse can be found, for example, in Japanese Patent Application laid-open No. 182393/2000 and No. 46050/1996.

In FIG. 13(a), there are disposed the first interconnection layer 117, the second interconnection layer 118 and the third interconnection layer 119, and the horizontal type fuse 120 is formed so as to connect the interconnections lying in the third interconnection layer 119 with each other. Formation of the horizontal type fuse 120 is made by filling up, with a buried material, a recess section which is formed in the interlayer insulating film placed between the second interconnection layer 118 and the third interconnection layer 119. As for the buried material, if the step of filling up the recess is performed concurrently with the step of forming via plugs and the likes, a material comprising essentially W or such is employed. The blowout of such a horizontal type fuse 120 is carried out by the irradiation of a laser beam L.

However, in the case of the horizontal type fuse, as shown in FIG. 13(b), some of the heat E of the laser beam L applied onto the fuse 121 may dissipate, being conducted along the fuse 121 and the interconnections 122 and 124, both of which are connected with respective end sections of the fuse 121. Consequently, the heat to blow the fuse may become insufficient and, in some cases, a part of the fuse remains as the fuse residue 123, as shown in FIG. 13(c).

Especially when the length of the horizontal type fuse is set small for the sake of miniaturization of the semiconductor device, the heat supplied by the laser beam irradiating the fuse does not stay within the fuse but spreads over, being conducted along the interconnections, so that faulty disconnection is very much liable to happen.

Further, in FIG. 14, there is shown a structure wherein a polyfuse 110 comprising polycrystalline silicon into which dopants are doped into a high concentration is formed on an element isolation oxide film 112. The interconnection 115 is connected with the polyfuse 110 as well as the source/drain region 116. The detailed description of the polyfuse can be found, for example, in Japanese Patent Application Laid-open No. 110447/1986.

When the blowout of the polyfuse 110 of this sort is made by the irradiation of a laser beam as indicated by L in the drawing, there are, as in the case of the horizontal type fuse, occasions on which faulty disconnection occurs, due to the heat dissipation.

Especially in the case of FIG. 14, since the polyfuse 110 is connected to the interconnection 115 by way of a buried section made of the same material as that of the interconnection 115, in the same way as described in Japanese Patent Application Laid-open No. 110447/1986, the heat is apt to spread over, giving rise to faulty disconnection.

SUMMARY OF THE INVENTION

In light of the above problems, an object of the present invention is to suppress the heat dissipation which may take place through the heat conduction along the fuse and the interconnection(s), and to attain good thermal storage at the irradiation site of the laser beam, and thereby to achieve a complete disconnection of the fuse.

Accordingly, the present invention provides a semiconductor device comprising a fuse which makes connection between a first interconnection and a second interconnection, and a first low heat-conductive section which makes connection between said first interconnection and a third interconnection at a site of said first interconnection where said fuse is not connected; wherein said first low heat-conductive section comprises a material having a heat conductivity lower than a heat conductivity of a material to form said first interconnection.

Further, the present invention provides a blowout method of a fuse through the use of a laser beam, a fuse making connection between one end of a first interconnection and one end of a second interconnection, wherein the other end of said first interconnection is connected to a low heat-conductive section which has a lower heat conductivity than said first interconnection and thereby a heat generated at a laser beam irradiation site is prevented from being conducted further beyond said low heat-conductive section.

An irradiation of said laser beam is hereat applied onto said fuse.

Alternatively, if said fuse is formed to be buried within a through hole which runs through an interlayer insulating film, and said first interconnection is formed in an upper layer of said interlayer insulating film so as to cover said fuse, an irradiation of said laser beam is applied onto the upper layer side of the contact site of said first interconnection for said fuse.

When the fuse is blown by the irradiation of a laser beam as described above, some of the heat supplied by the laser bean may dissipate, being conducted along the fuse and the first interconnection. Yet, because the first interconnection is connected to a first low heat-conductive section having a heat conductivity lower than that of the first interconnection, the heat is prevented from being conducted further beyond the first low heat-conductive section. As a result, the heat is stored at the laser beam irradiation site and the complete blowout of the fuse may be achieved.

Accordingly, the present invention can replace faulty cells with redundancy cells, for certain, through blowout of the fuse, which is made by the laser beam irradiation. Further, the present invention can disconnect, for certain, the test cell and the likes from the memory cell(s), the logic cell(s) and the likes.

As set forth above, in a semiconductor device comprising a fuse which makes connection between a first interconnection and a second interconnection, and a first low heat-conductive section which makes connection between the first interconnection and a third interconnection at a site of the first interconnection where the fuse is not connected, the first low heat-conductive section is fabricated from a material having a heat conductivity lower than that of the material to form the first interconnection, whereby in making the fuse blown with the laser beam irradiation, the heat dissipation through the heat conduction along the fuse and the interconnection is well suppressed, and, therefore, the disconnection at the fuse can be achieved, satisfactorily.

DETAILED DESCRIPTION

Figure 1:
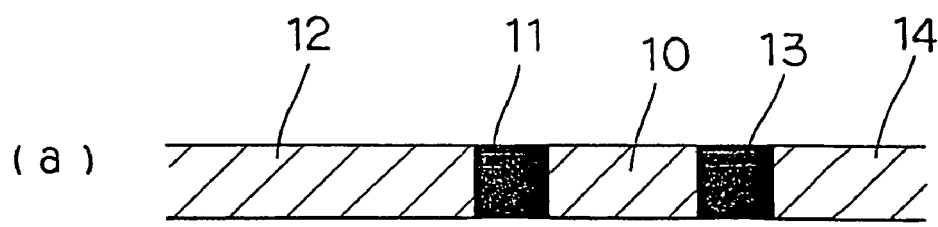
FIG. 1 is a pair of a schematic plan view (a) and cross-sectional view (b) showing a semiconductor device according to the present invention.
Figure 1:
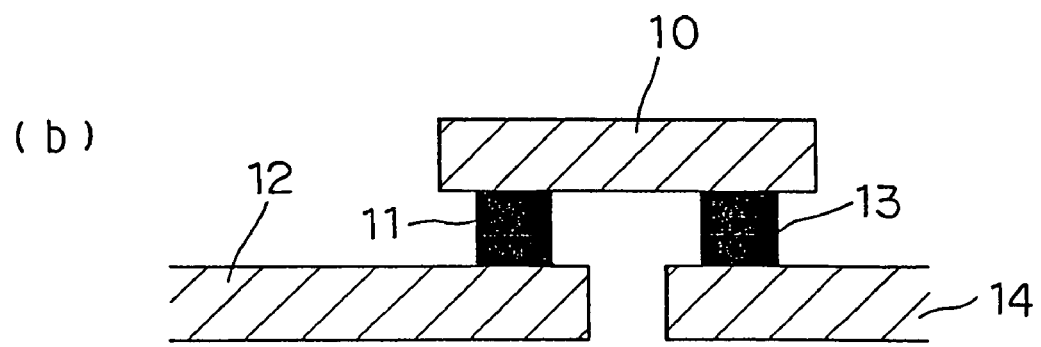

In FIG. 1, there are shown a plan view (a) and a cross-sectional view (b) of one example of a semiconductor device structure, in the case that the fuse 11 and the first low heat-conductive section 13 are vertical type. In this case, the first interconnection 10 and the second interconnection 12 are connected to each other through the fuse 11, and at a site of the first interconnection 10 where the fuse is not connected, the first interconnection 10 and the third interconnection 14 are connected to each other through the first low heat-conductive section 13. In addition, the first low heat-conductive section 13 is formed from a material having a heat conductivity lower than that of the material to form the first interconnection 10.

More specifically, this first example of a semiconductor device has a multi-layered interconnection structure as shown in FIG. 2(c), comprising a fuse 169 which is formed by filling up, with a buried material, a through hole formed to run through an interlayer insulating film 167; a first low heat-conductive section 170 which is formed by filling up, with the buried material, another through hole formed to run through the interlayer insulating film 167; a first interconnection 172 which is connected to the fuse 169 and the first low heat-conductive section 170 and formed in an upper layer (or a lower layer) of the interlayer insulating film 167; a second interconnection 166 which is connected to the fuse 169 and formed in a layer other than the one for the first interconnection 172; and a third interconnection 165 which is connected to the first low heat-conductive section 170 and formed in the layer other than the one for the first interconnection 172. The first low heat-conductive section 170 is fabricated from a buried material having a heat conductivity lower than that of the material to form the first interconnection 172.

Herein, the second interconnection 166 is connected to a source/drain region 162 through a contact plug 164, and under these interconnection layers there is formed an underlying transistor comprising a gate electrode 161, an element isolation oxide film 160 and such.

Figure 3:
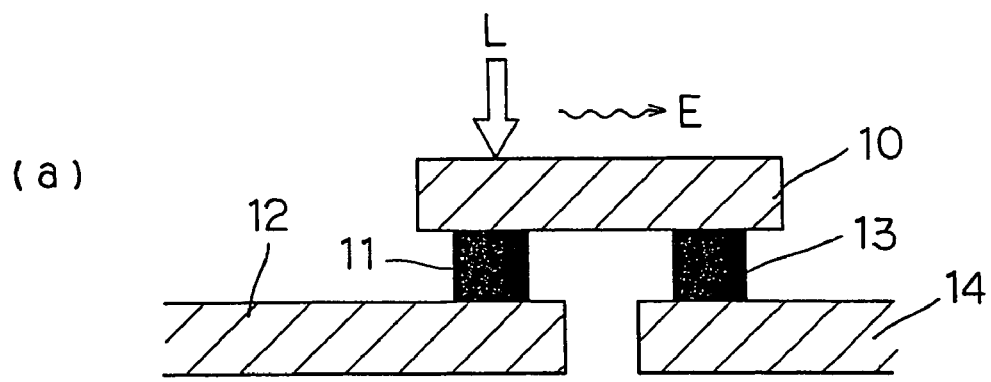
FIG. 3 is a pair of schematic cross-sectional views in explaining a semiconductor device according to the present invention.
Figure 3:
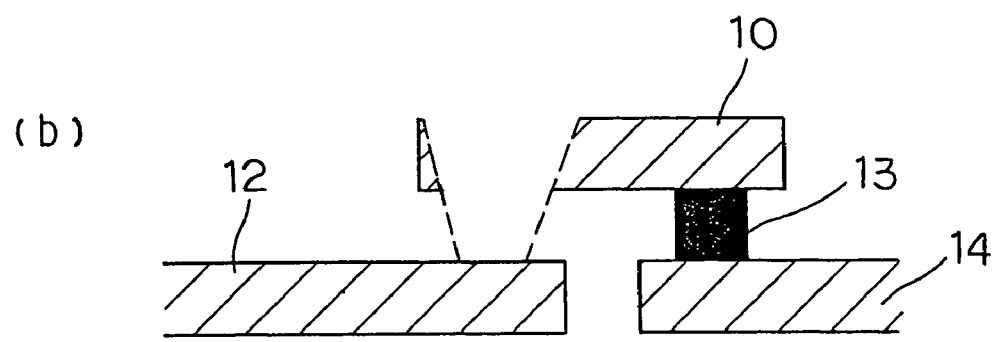

As shown in FIG. 3(a), the first interconnection 10 is formed in the upper layer of the interlayer insulating film, and in order to make the vertical type fuse 11 blown, a laser beam L is applied from the upper layer side onto the contact site of the first interconnection (the upper layer interconnection) 10 for the fuse 11.

In this case, a part of the heat E is conducted to the fuse 11 by way of the upper layer interconnection (the first interconnection) 10, but, at the same time, the other part thereof may be conducted along the upper layer interconnection (the first interconnection) 10 towards the right in the drawing to dissipate. Especially when the upper layer interconnection (the first interconnection) 10 essentially comprises Al, Cu or the like which has a high heat conductivity, the heat rapidly dissipates, being conducted along the interconnection. However, since the upper layer interconnection (the first interconnection) 10 is connected with the first low heat-conductive section 13, the heat E is prevented from being conducted towards the lower layer interconnection (the third interconnection) 14 by way of the first low heat-conductive section 13. Therefore, the heat is stored in the vicinity of the laser beam irradiation site, and sufficiently strong heat is transmitted to the fuse 11 through the upper layer interconnection (the first interconnection) 10. This results in a substantially complete blowout of the fuse, as shown in FIG. 3(b).

Accordingly, when the fuse is vertical type and the first interconnection essentially comprises an interconnection material with a high heat conductivity such as Al or Cu, it is a particularly effective method to connect the first low heat-conductive section with the first interconnection.

Figure 2:
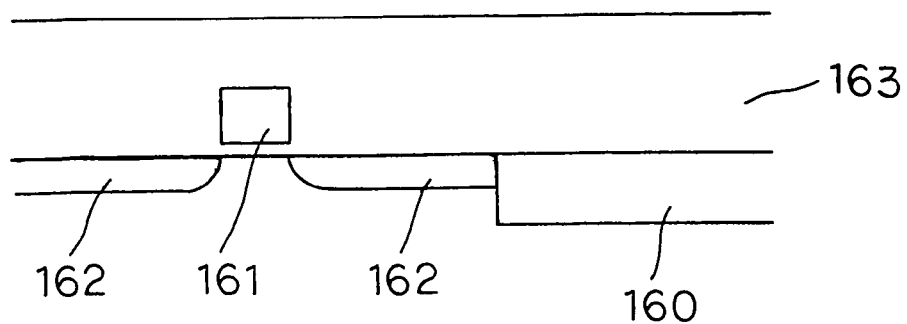
FIG. 2 is a series of cross-sectional views illustrating the steps of a manufacturing method of a semiconductor device according to the present invention.
Figure 2:
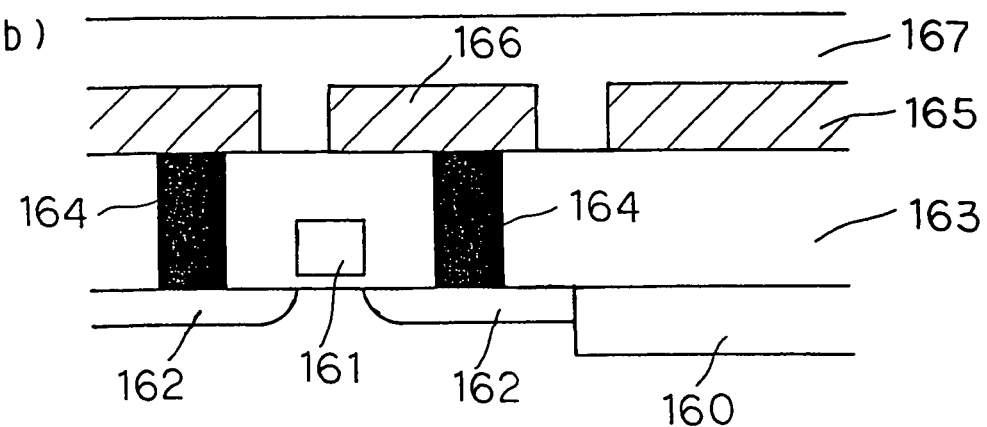
Figure 2:
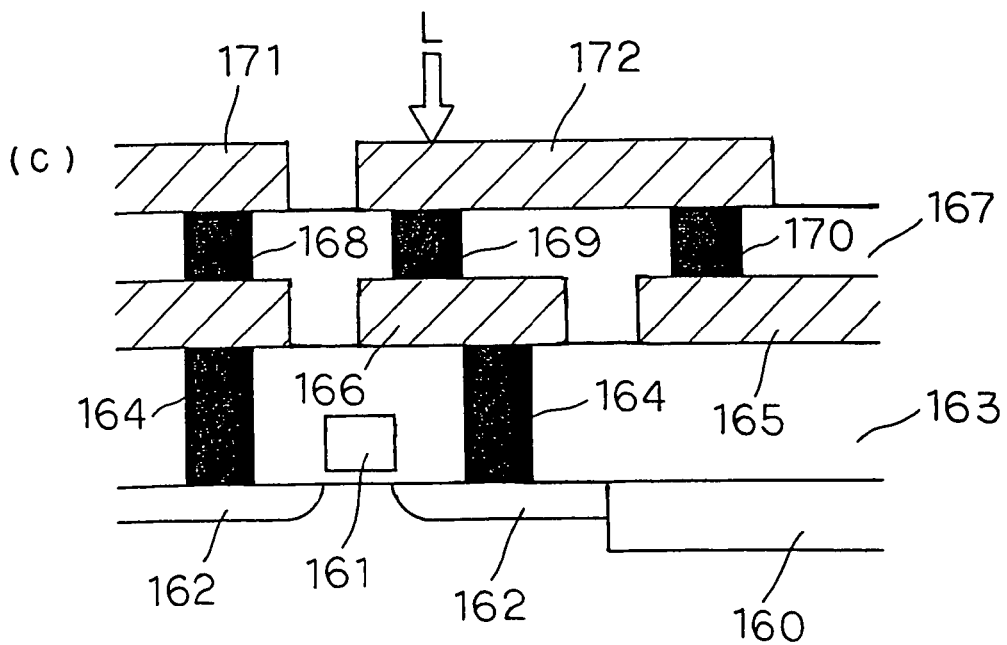

FIG. 2 illustrates the steps of a method of manufacturing a semiconductor device in which a vertical type fuse and a vertical type low heat-conductive section are disposed. Firstly, an element isolation oxide film 160 is formed on a silicon substrate and thereafter a gate oxide film, a gate electrode 161 and source/drain regions 162 are formed and then a first interlayer insulating film 163 is applied to the entire surface thereof to obtain a structure shown in FIG. 2(a). Hereat, a silicide layer may be formed on the gate electrode 161 as well as the source/drain regions 162, if circumstances require.

Next, contact holes are made open through the first interlayer insulating film 163 to reach the source/drain regions 162 and filled up with a buried material to form contact plugs 164. After that, over the entire surface thereof, a metal film which essentially comprises Al or Cu is formed and then patterned, and thereby a second interconnection 166 and a third interconnection 165 are formed in a first interconnection layer. A second interlayer insulating film 167 is then applied over the entire surface thereof to obtain a structure shown in FIG. 2(b). Hereat, a barrier film which is not shown in the drawing may be formed, if required.

Subsequently, a via hole is made through the second interlayer insulating film 167 to reach the interconnection lying in the first interconnection layer and filled up with a buried material to form a via plug 168. Concurrently with this, a through hole to reach the second interconnection 166 and another through hole to reach the third interconnection 165 are made open and filled up with the buried material(s) to form a fuse 169 and a first low heat-conductive section 170, respectively. After that, over the entire surface thereof, a metal film essentially comprising Al or Cu is formed and then patterned, and thereby a first interconnection 172 and an interconnection 171 are formed in a second interconnection layer to obtain a structure shown in FIG. 2(c). Hereat, a barrier film which is not shown in the drawings may be formed, if required.

For the buried material to form a vertical type first low heat-conductive section 170, there is no specific limitation as long as it is a material having a heat conductivity lower than that of the interconnection material for the first interconnection 172. Examples for such a buried material include; materials containing W such as tungsten and tungsten silicide; materials containing polycrystalline silicon such as polycrystalline silicon and doped polycrystalline silicon into which phosphorus is doped at a high concentration; silicides such as titanium silicide, cobalt silicide, molybdenum silicide, tantalum silicide and platinum silicide; materials containing Mo; materials containing Cr; materials containing V; and layered structures in which two or more layers made of materials selected from the above materials are laid such as polycides.

Among them, for the vertical type low heat-conductive section which is fabricated by filling up the inside of the through hole with the buried material, materials containing W such as tungsten, tungsten silicide and tungsten polycide are preferable, because they have considerably low heat conductivities and excellent adaptabilities to be buried.

For the buried material to form a vertical type fuse 169, there is no specific limitation, and its examples include; materials containing W such as tungsten and tungsten silicide; materials containing polycrystalline silicon such as polycrystalline silicon and doped polycrystalline silicon into which phosphorus is doped at a high concentration; silicides such as titanium silicide, cobalt suicide, molybdenum silicide, tantalum silicide and platinum silicide; materials containing Mo; materials containing Cr; materials containing V; layered structures in which two or more layers made of materials selected from the above materials are laid such as polycides; interconnection materials essentially comprising Al; and interconnection materials essentially comprising Cu.

Among them, for the vertical type fuse which is fabricated by filling up the inside of the through hole with the buried material, materials containing W such as tungsten, tungsten silicide and tungsten polycide are preferable, because they have considerably low heat conductivities and excellent adaptabilities to be buried.

Hereat, for example, in FIG. 2(c), if the fuse 169 and the low heat-conductive section 170 are to be fabricated from the same material, the fuse 169 and the low heat-conductive section 170 can be formed concurrently in one and the same step, which provides excellent productivity. Further, if the via plug 168 is to be fabricated from the same material as the fuse 169 and the low heat-conductive section 170, all of them can be formed concurrently together so that the productivity can be raised still further.

The vertical type fuse 169 in a semiconductor device manufactured as described above can be blown by the irradiation of a laser beam L as shown in FIG. 2(c). In this instance, since the first interconnection 172 through which the main part of the heat is conducted is connected with the first low heat-conductive section 170, the heat dissipation can be well suppressed.

In practice, the irradiation of the laser beam is applied to the first interconnection 172, at least, through a passivation film (omitted from the drawing). The film thickness of the passivation film is set to be preferably not less than 30 nm for protecting the interconnection from corrosion by the moisture or the like, but preferably not greater than 100 nm to achieve complete blowout of the fuse for certain. Further, according to the position where the fuse is formed, the irradiation of a laser beam may be applied to the fuse by way of the interconnection and the interlayer insulating film lying in the upper layer(s) with respect to the first interconnection. On such occasions, the fuse is preferably formed in the uppermost layer within the limits of possibility in order to enhance the irradiation accuracy of the laser beam and increase the blowout efficiency of the fuse by the laser beam.

Figure 4:
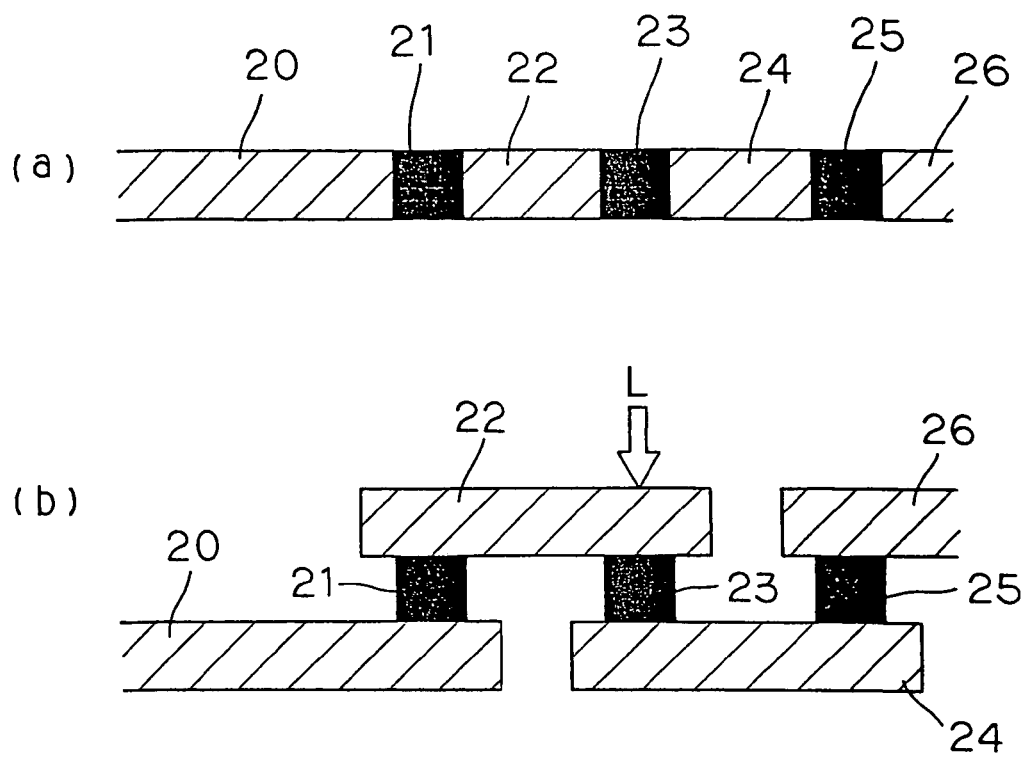
FIG. 4 is a pair of a schematic plan view (a) and cross-sectional view (b) showing another semiconductor device according to the present invention.

In FIG. 4, there are shown a plan view (a) and a cross-sectional view (b) of the second example of a semiconductor device structure, in the case that the fuse and the low heat-conductive sections are vertical type. In this case, the first interconnection 22 and the second interconnection 24 are connected to each other through the fuse 23, and at a site of the first interconnection 22 where the fuse 23 is not connected, the first interconnection 22 and the third interconnection 20 are connected to each other through the first low heat-conductive section 21. In addition, at a site of the second interconnection 24 where the fuse 23 is not connected, the second interconnection 24 and the fourth interconnection 26 are connected to each other through the second low heat-conductive section 25. The first low heat-conductive section 21 is formed from a material having a heat conductivity lower than that of the material to form the first interconnection 22. In addition, the second low heat-conductive section 25 is formed from a material having a heat conductivity lower than that of the material to form the second interconnection 24.

In FIG. 4, not only the first interconnection 22 is connected with the first low heat-conductive section 21 but also the second interconnection 24 is connected with the second low heat-conductive section 25 so that, in this structure, both interconnections with which the vertical type fuse 23 is connected are connected with respective low heat-conductive sections.

In this case, the blowout of the fuse 23 is made by irradiating the site indicated by an arrow of FIG. 4(b) with a laser beam L. Hereat, the heat dissipation may take place through the heat conduction along the first interconnection 22 as well as through the heat conduction along the second interconnection 24 by way of the fuse 23. Yet, because not only the first interconnection 22 is connected with the first low heat-conductive section 21 but also the second interconnection 24 is connected with the second low heat-conductive section 25, the heat is prevented from being conducted further beyond these low heat-conductive sections. As a result, the heat is stored at the laser beam irradiation site and the complete blowout of the fuse is achieved satisfactorily.

Figure 12:
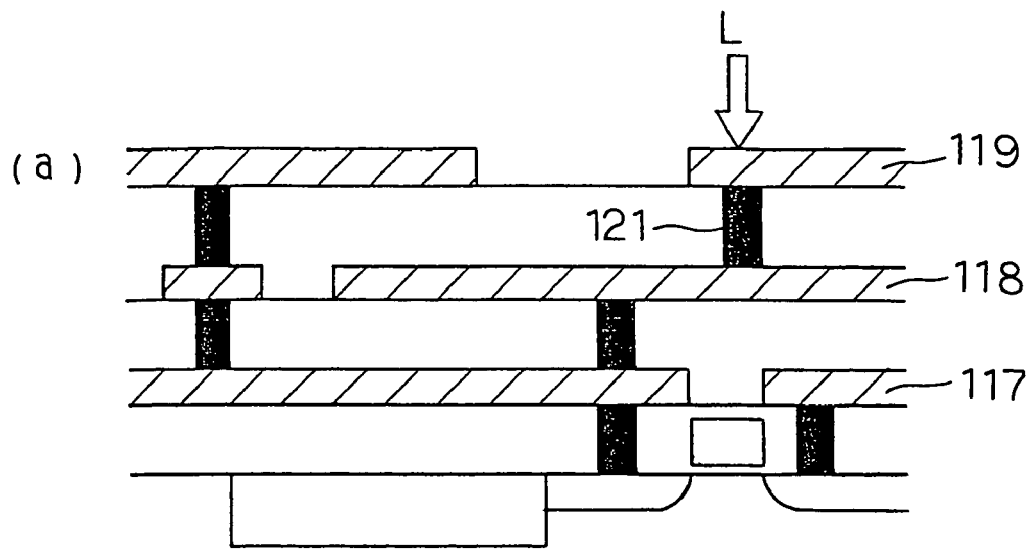
FIG. 12 is a group of schematic cross-sectional views in explaining a conventional semiconductor device.
Figure 12:
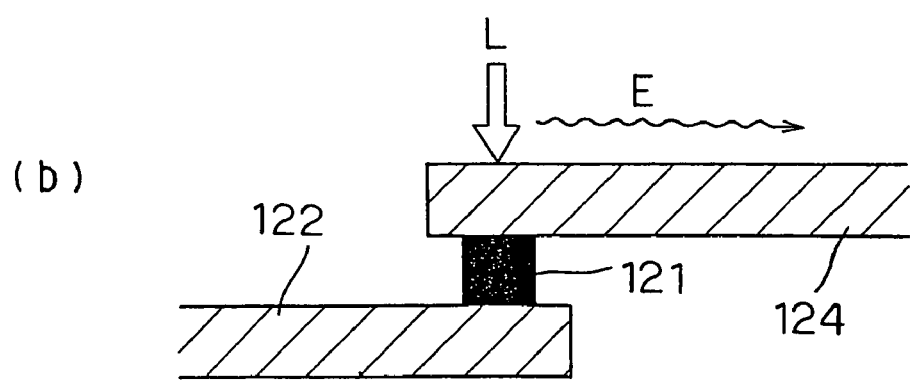
Figure 12:
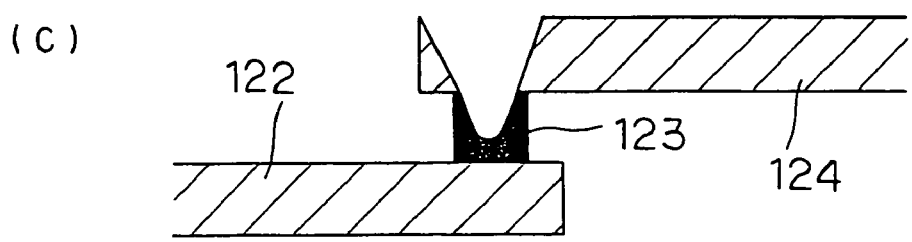
Figure 13:
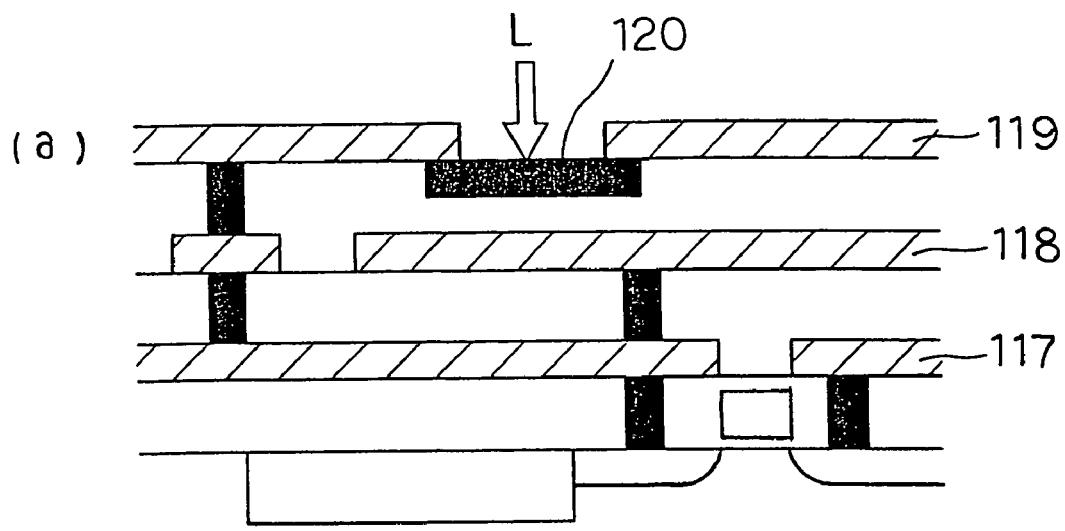
FIG. 13 is a group of schematic cross-sectional views in explaining another conventional semiconductor device.
Figure 13:
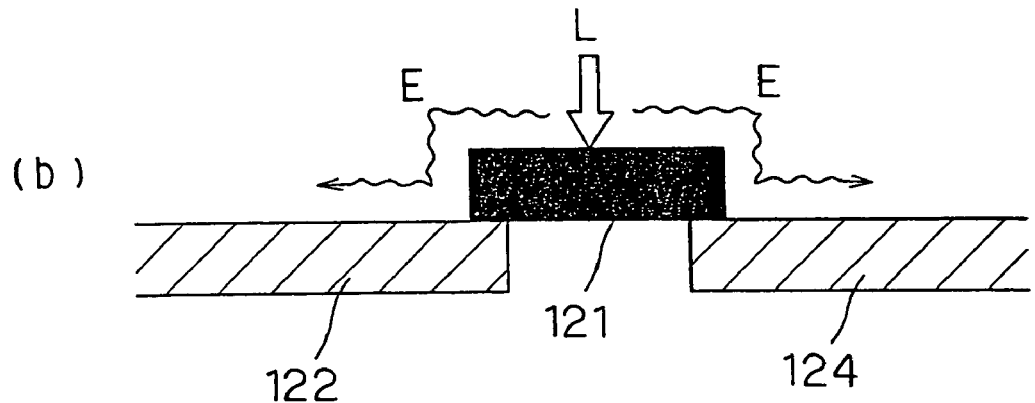
Figure 13:
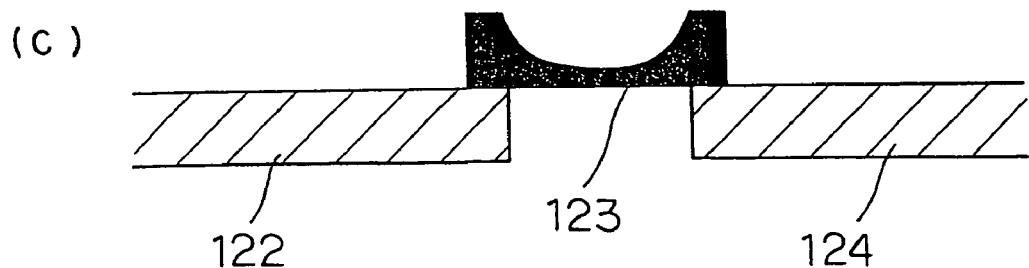
Figure 14:
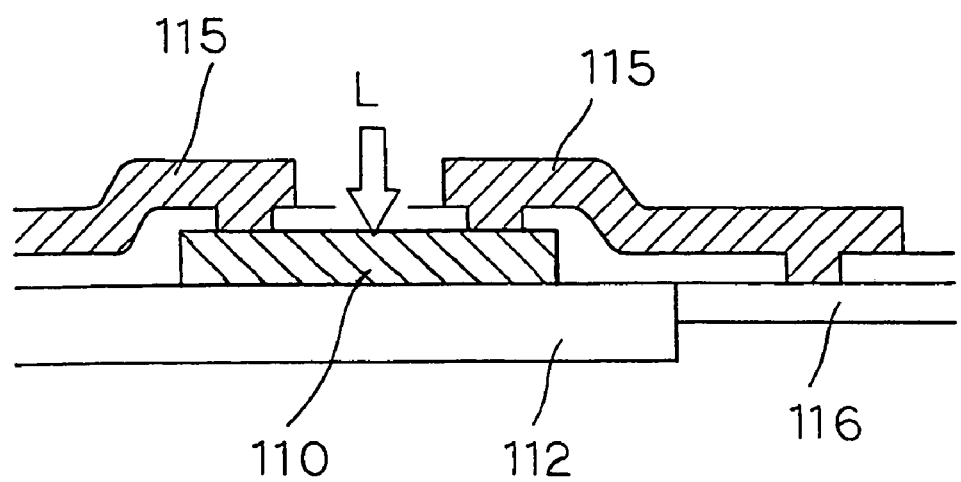
FIG. 14 is a schematic cross-sectional view in explaining another conventional semiconductor device.

Further, the disposition of the second low heat-conductive section can increase the degree of freedom for the interconnection layer structure. For instance, in some cases, the introduction of a low heat-conductive section into an interconnection layer alters three-dimensional relationship of the whole interconnection layers, but their relationship can be restored by disposing a second low heat-conductive section. Specifically, in such an interconnection structure as shown in FIG. 12(b), wherein, seen from the left of the drawing up to the right end in sequence, the lower layer interconnection 122 is connected through the fuse 121 to the upper layer interconnection 124, the introduction of a first low heat-conductive section 13 alters the vertical relationship between the interconnections seen on the left and the right of the drawing, as shown in FIG. 1(b). That is, by disposing the first low heat-conductive section 13, the interconnection structure of FIG. 1(b) becomes such that, seen from the left of the drawing up to the right end in sequence, the lower layer interconnection 12 is connected through the fuse 11 to the upper layer interconnection 10 and, then, further connected through the first low heat-conductive section 13 to the lower layer interconnection 14. In contrast with this, by disposing the second low heat-conductive section 25, the interconnection structure becomes such that the lower layer interconnection 24 is further connected through the second low heat-conductive section 25 to the upper layer interconnection 26 to reach the right end of the drawing, and thereby the vertical relationship between the interconnections seen on the left and the right of the drawing is restored.

Further, in FIG. 4, it is possible to dispose additional low heat-conductive sections such as a third low heat-conductive section to connect with the third interconnection 20 and a fourth low heat-conductive section to connect the fourth interconnection 26. By increasing the number of low heat-conductive sections, heat dissipation can be better suppressed and therefore the degree of freedom in the interconnection layer structure can be raised further.

Figure 5:
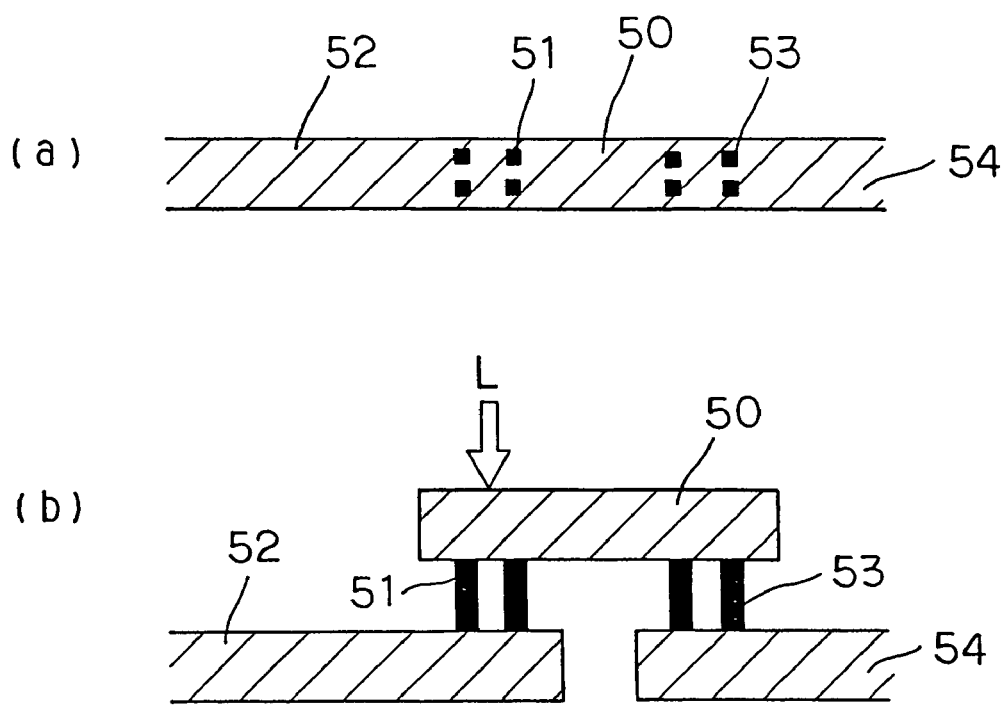
FIG. 5 is a pair of a schematic plan view (a) and cross-sectional view (b) showing another semiconductor device according to the present invention.

Further, when the fuse is vertical type, a plurality of first plugs 51 buried in a plurality of through holes which are formed to run through the interlayer insulating film may be connected in parallel between the first interconnection 50 and the second interconnection 52, as shown in FIG. 5, and thereby the fuse can be formed. Hereat, the aspect ratio of the first plug 51 is set to be preferably not less than 1 and more preferably not less than 1.1, but preferably not greater than 5 and more preferably not greater than 3.

In this instance, a plurality of first plugs, each having a small top area and a small base area, are disposed as the fuse, and a laser beam L irradiates the site thereof indicated by an arrow.

When the top area and the base area of the fuse are small, the amount of the heat required to blow the fuse decreases so that the blowout can be achieved more readily. On the other hand, with the disposition of a plurality of fuses, the increase in resistance, the occurrence of the faulty connection and the likes, which may be caused by making the top area and the base area of the fuse small, can be well suppressed.

Further, when the low heat-conductive section is vertical type, a plurality of second plugs 53 buried in a plurality of through holes which are formed to run through the interlayer insulating film may be connected in parallel between the first interconnection 50 and the third interconnection 54, as shown in FIG. 5, and thereby the low heat-conductive section can be formed. Hereat, the aspect ratio of the second plug 53 is set to be preferably not less than 1 and more preferably not less than 1.1, but preferably not greater than 5 and more preferably not greater than 3.

In this instance, a plurality of second plugs, each having a small top area and a small base area, are disposed as the low heat-conductive section.

When the top area and the base area of the low heat-conductive section are small, the cross-section of the path for the heat to pass through is reduced so that the heat dissipation can be suppressed better. On the other hand, with the disposition of a plurality of low heat-conductive sections, the increase in resistance, the occurrence of the faulty connection and the likes, which may be caused by making the top area and the base area of the low heat-conductive section small, can be well suppressed.

Figure 6:
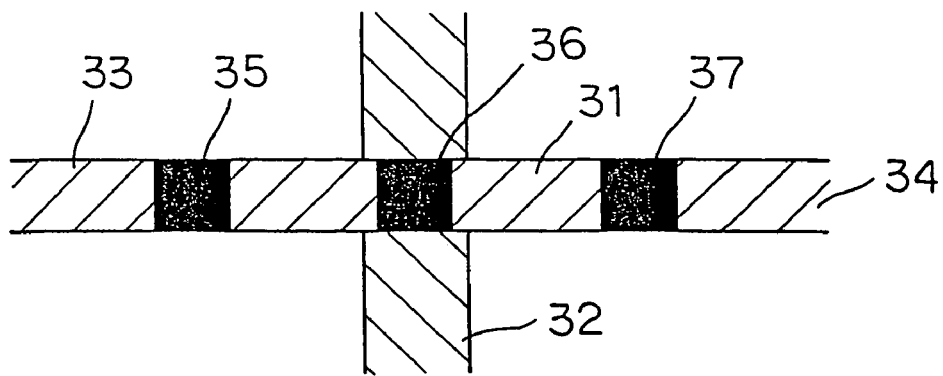
FIG. 6 is a pair of a schematic plan view (a) and cross-sectional view (b) showing another semiconductor device according to the present invention.
Figure 6:
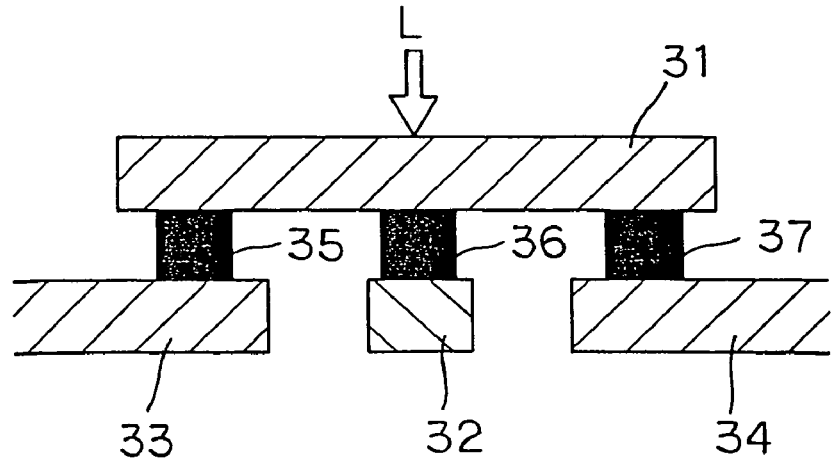

In FIG. 6, there are shown a plan view (a) and a cross-sectional view (b) of the third example of a semiconductor device structure, in the case that the fuse and the low heat-conductive sections are vertical type. In this case, the first interconnection 31 and the second interconnection 32 are connected to each other through the fuse 36, and at a site of the first interconnection 31 where the fuse 36 is not connected, the first interconnection 31 and the third interconnection 33 are connected to each other through the first low heat-conductive section 35. In addition, at a site of the first interconnection 31 where neither the fuse 36 nor the first low heat-conductive section 35 is connected, the first interconnection 31 and the fifth interconnection 34 are connected to each other through the third low heat-conductive section 37. The first low heat-conductive section 35 is formed from a material having a heat conductivity lower than that of the material to form the first interconnection 31. In addition, the third low heat-conductive section 37 is formed from a material having a heat conductivity lower than that of the material to form the first interconnection 31.

In FIG. 6, the first interconnection 31 and the second interconnection 32 intersect each other, as illustrated in the plan view (a). Herein, one end of the first interconnection 31 is connected to the first low heat-conductive section 35, and besides the other end thereof is connected to the third low heat-conductive section 37. In other words, both ends of the first interconnection 31 to which the heat supplied by the laser beam L is mainly transmitted are connected with respective low heat-conductive sections.

The blowout of the fuse 36 is made by irradiating the site indicated by an arrow of FIG. 6(b) with a laser beam L. Hereat, the heat may be conducted along the first interconnection 22 towards both end sections to dissipate. Yet, because both ends of the first interconnection 31 are connected with the first low heat-conductive section 35 and the third low heat-conductive section 37, respectively, the heat is prevented from being conducted further beyond these low heat-conductive sections. As a result, the heat is stored at the laser beam irradiation site and the complete blowout of the fuse 36 is achieved satisfactorily.

Figure 7:
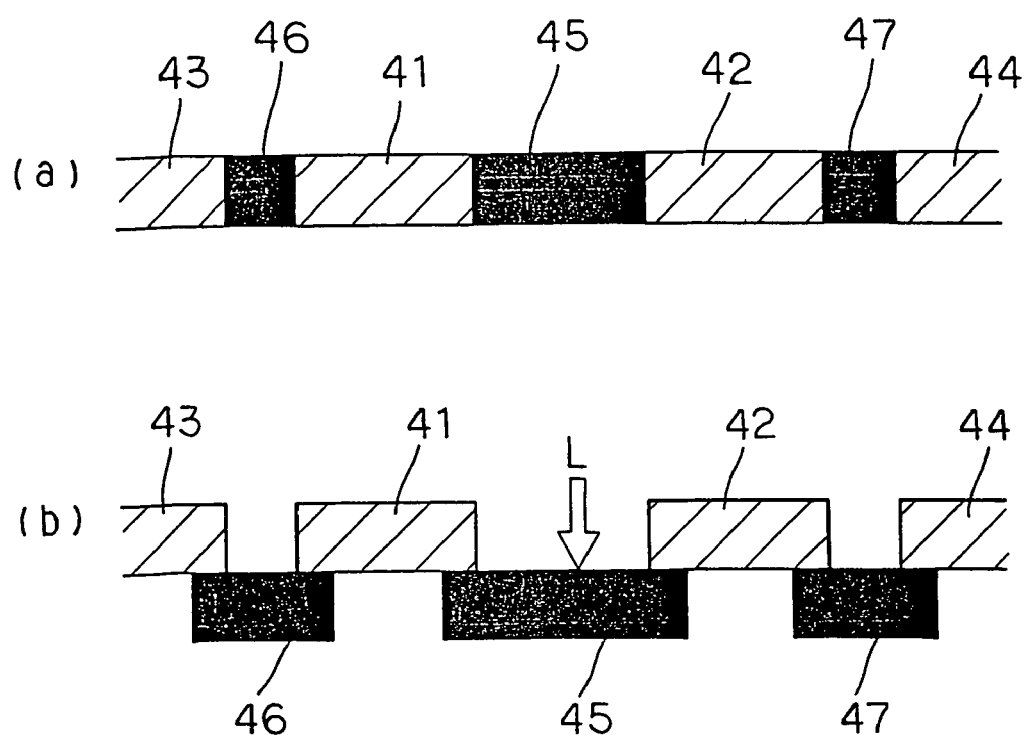
FIG. 7 is a pair of a schematic plan view (a) and cross-sectional view (b) showing another semiconductor device according to the present invention.

In FIG. 7, there are shown a plan view (a) and a cross-sectional view (b) of another example of a semiconductor device structure, in the case that the fuse and the low heat-conductive sections are horizontal type. In this case, the first interconnection 41 and the second interconnection 42 are connected to each other through the fuse 45, and at a site of the first interconnection 41 where the fuse 45 is not connected, the first interconnection 41 and the third interconnection 43 are connected to each other through the first low heat-conductive section 46. In addition, at a site of the second interconnection 42 where the fuse 45 is not connected, the second interconnection 42 and the fourth interconnection 44 are connected to each other through the second low heat-conductive section 47. The first low heat-conductive section 46 is formed from a material having a heat conductivity lower than that of the material to form the first interconnection 41. In addition, the second low heat-conductive section 47 is formed from a material having a heat conductivity lower than that of the material to form the second interconnection 42.

In FIG. 7, not only the first interconnection 41 is connected with the first low heat-conductive section 46 but also the second interconnection 42 is connected with the second low heat-conductive section 47 so that, in this structure, both interconnections with which the horizontal type fuse 45 is connected are connected with respective low heat-conductive sections.

In this case, the blowout of the fuse 45 is made by irradiating the site indicated by an arrow of FIG. 7(b) with a laser beam L. Hereat, the heat dissipation may take place through the heat conduction along the fuse 45 towards both ends and then through the heat conduction along the first interconnection 41 and the second interconnection 42.

Yet, because not only the first interconnection 41 is connected with the first low heat-conductive section 46 but also the second interconnection 42 is connected with the second low heat-conductive section 47, the heat is prevented from being conducted further beyond these low heat-conductive sections. As a result, the heat is stored at the laser beam irradiation site and the complete blowout of the fuse 45 is achieved satisfactorily.

Further, in FIG. 7, it is possible to dispose additional low heat-conductive sections such as a third low heat-conductive section to connect with the third interconnection 43 and a fourth low heat-conductive section to connect the fourth interconnection 44. By increasing the number of low heat-conductive sections, heat dissipation can be better suppressed and therefore the degree of freedom in the interconnection layer structure can be raised further.

Further, while, in FIG. 7, both interconnections with which the fuse is connected are connected with respective low heat-conductive sections, there are occasions on which only one interconnection is connected with a low heat-conductive section. On such occasions, although the effect of suppressing the heat dissipation may be lowered, the space required to form the low heat-conductive section(s) can be reduced.

Figure 8:
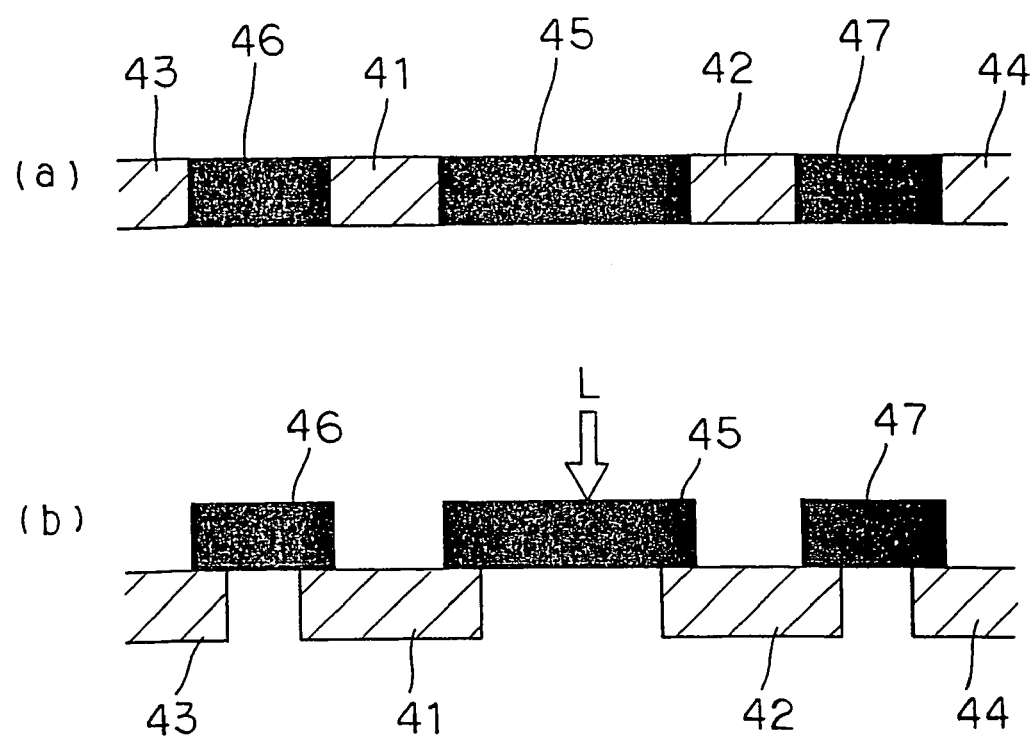
FIG. 8 is a pair of a schematic plan view (a) and cross-sectional view (b) showing another semiconductor device according to the present invention.

Further, as shown in FIG. 8, the fuse 45 and the low heat-conductive sections 46 and 47 can be formed in the upper layer of the interconnection layer.

In FIG. 9(c), there is shown a more specific example of a horizontal type fuse and a horizontal type low heat-conductive section. That is, this example of a semiconductor device has a multi-layered interconnection structure, as shown in FIG. 9(c), comprising a fuse 272 which is formed by filling up, with a buried material, a recess section formed in an interlayer insulating film 267 (or a trench formed to run through the interlayer insulating film 267); a first low heat-conductive section 270 which is formed by filling up, with the buried material, another recess section formed in the interlayer insulating film 267 (or another trench formed to run through the interlayer insulating film 267); and a first interconnection 271, a second interconnection 273 and a third interconnection 269 which are formed in an upper layer (or a lower layer) of the interlayer insulating film 267; wherein one end and the other end of the fuse 272 are connected to the first interconnection 271 and the second interconnection 273, respectively, and one end of the first low heat-conductive section 270 is connected to the other end of the first interconnection 271, while the other end of the first low heat-conductive section 270 is connected to the third interconnection 269. The first low heat-conductive section 270 is fabricated from a buried material having a heat conductivity lower than that of the material to form the first interconnection 271.

Herein, the third interconnection 269 is connected to an interconnection 265 lying in the first interconnection layer through a via plug 268, and under these interconnection layers there is formed an underlying transistor comprising a gate electrode 261, source/drain regions 262 and an element isolation oxide film 260 and such. The interconnection 265 in the first interconnection layer is connected to a source/drain region 262 through a contact plug 264.

Figure 10:
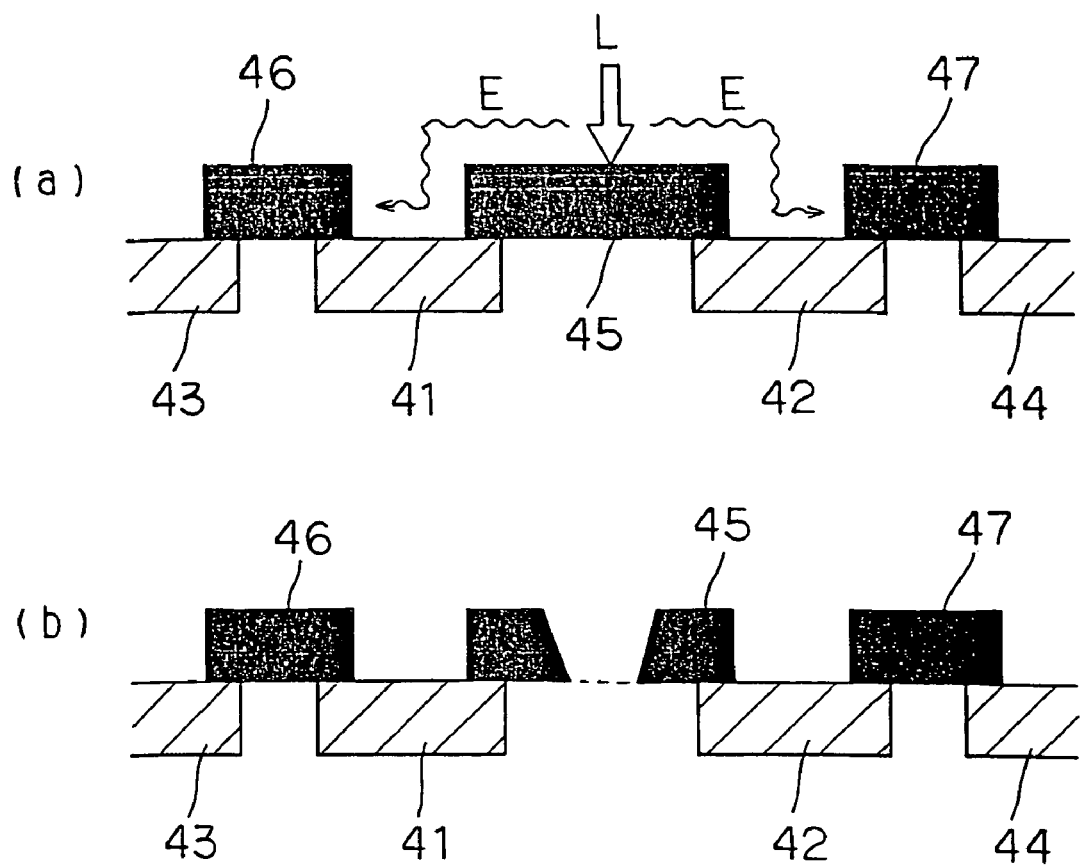
FIG. 10 is a pair of schematic cross-sectional views in explaining a semiconductor device according to the present invention.

In order to make such a horizontal type fuse 11 blown, as shown in FIG. 10(a), a laser beam L is applied from the upper layer side onto the fuse 45. In this instance, a part of the heat E is conducted by way of the fuse 45 and, then, conducted further along the first interconnection 41 or the second interconnection 42 to dissipate towards the left or the right of the drawing.

Especially when the length of the horizontal type fuse becomes small for the sake of miniaturization, the heat given by the laser irradiating the fuse may not stay within the fuse but spread over, being conducted along the interconnection(s), so that faulty disconnection is liable to happen. Further; when the interconnection is mainly composed of Al or Cu, which has a large heat conductivity, the heat dissipation is particularly rapid.

However, since the first interconnection 41 is connected with the first low heat-conductive section 46, the heat E is prevented from being conducted towards the third interconnection 43 by way of the first low heat-conductive section 46. Further, since the second interconnection 42 is connected with the second low heat-conductive section 47, the heat E is prevented from being conducted towards the fourth interconnection 44 through the second low heat-conductive section 47. Therefore, the heat is stored in the vicinity of the laser beam irradiation site, and a substantially complete blowout of the fuse can be achieved, as shown in FIG. 10(b).

Figure 9:
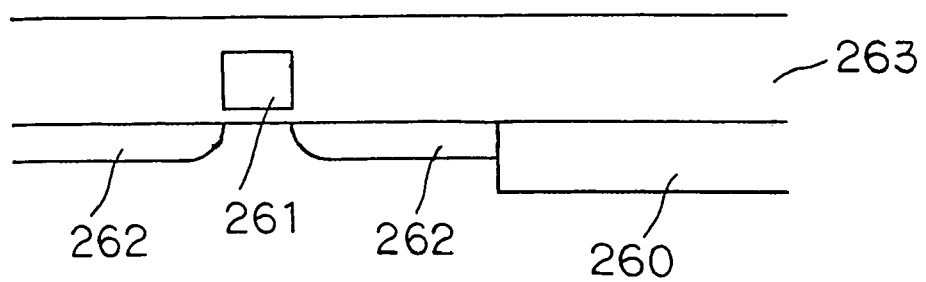
FIG. 9 is a series of cross-sectional views illustrating the steps of a manufacturing method of a semiconductor device according to the present invention.
Figure 9:
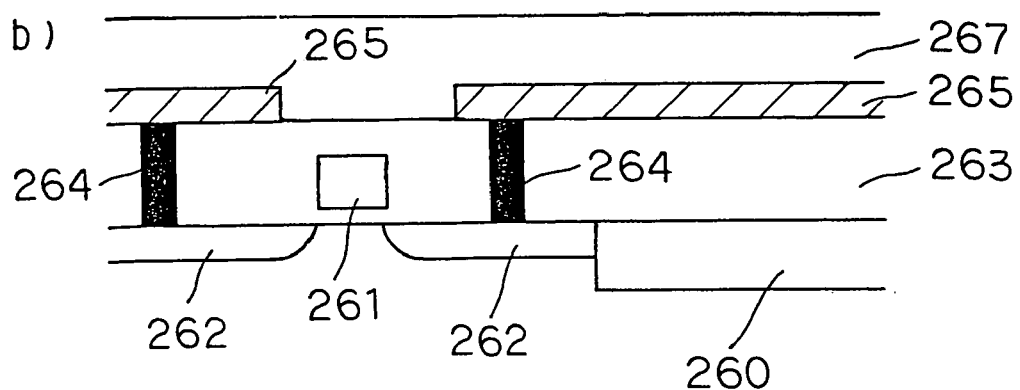
Figure 9:
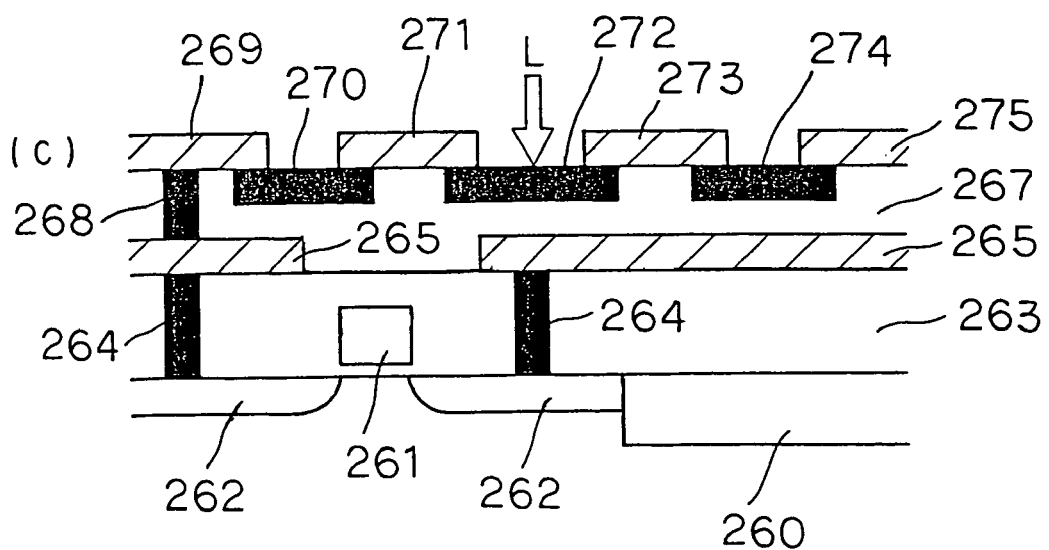

FIG. 9 illustrates the steps of a method of manufacturing a semiconductor device in which a horizontal type fuse and a horizontal type low heat-conductive section are disposed. Firstly, an element isolation oxide film 260 is formed on a silicon substrate and thereafter a gate oxide film, a gate electrode 261 and source/drain regions 262 are formed and then a first interlayer insulating film 263 is applied to the entire surface thereof to obtain a structure shown in FIG. 9(a). Hereat, a silicide layer may be formed on the gate electrode 261 as well as the source/drain regions 262, if circumstances require.

Next, contact holes are made open through the first interlayer insulating film 263 to reach the source/drain regions 262 and filled up with a buried material to form contact plugs 264. After that, over the entire surface thereof, a metal film which essentially comprises Al or Cu is formed and then patterned, and thereby an interconnection 265 is formed in a first interconnection layer. A second interlayer insulating film 267 is then applied over the entire surface thereof to obtain a structure shown in FIG. 9(b). Hereat, a barrier film which is not shown in the drawing may be formed, if required.

Subsequently, a via hole is made through the second interlayer insulating film 267 to reach the interconnection 265 and filled up with a buried material to form a via plug 268. Further, a plurality of recess sections are formed in the second interlayer insulating film 267 and filled up with a buried material to form a fuse 272, a first low heat-conductive section 270 and a second low heat-conductive section 274. After that, over the entire surface thereof, a metal film essentially comprising Al or Cu is formed and then patterned, and thereby a first interconnection 271, a second interconnection 273 and a third interconnection 269 and a fourth interconnection 275 are formed to obtain a structure shown in FIG. 9(c). Hereat, a barrier film which is not shown in the drawings may be formed, if required.

For the buried material to form a horizontal type low heat-conductive section 270, there is no specific limitation as long as it is a material having a heat conductivity lower than that of the interconnection material for the first interconnection 271. Examples for such a buried material include; materials containing W such as tungsten and tungsten silicide; materials containing polycrystalline silicon such as polycrystalline silicon and doped polycrystalline silicon into which phosphorus is doped at a high concentration; silicides such as titanium silicide, cobalt silicide, molybdenum silicide, tantalum silicide and platinum silicide; materials containing Mo; materials containing Cr; materials containing V; and layered structures in which two or more layers made of materials selected from the above materials are laid such as polycides.

Among them, for the horizontal type low heat-conductive section which is fabricated by filling up, with the buried material, the inside of the recess section formed in the interlayer insulating film, materials containing W such as tungsten, tungsten silicide and tungsten polycide are preferable, because they have considerably low heat conductivities and excellent adaptabilities to be buried.

Further, the materials containing polycrystalline silicon such as polycrystalline silicon and doped polycrystalline silicon into which phosphorus is doped at a high concentration are also preferable due to their low heat conductivities.

For the buried material to form a horizontal type fuse 272, there is no specific limitation, and its examples include; materials containing W such as tungsten and tungsten silicide; materials containing polycrystalline silicon such as polycrystalline silicon and doped polycrystalline silicon into which phosphorus is doped at a high concentration; silicides such as titanium silicide, cobalt silicide, molybdenum silicide, tantalum silicide and platinum silicide; materials containing Mo; materials containing Cr; materials containing V; layered structures in which two or more layers made of materials selected from the above materials are laid such as polycides; interconnection materials essentially comprising Al; and interconnection materials essentially comprising Cu.

Among them, for the horizontal type fuse which is fabricated by filling up, with the buried material, the inside of the recess section formed in the interlayer insulating film, materials containing W such as tungsten, tungsten silicide and tungsten polycide are preferable, because they have considerably low heat conductivities and excellent adaptabilities to be buried.

Further, the materials containing polycrystalline silicon such as polycrystalline silicon and doped polycrystalline silicon into which phosphorus is doped at a high concentration are also preferable due to their low heat conductivities.

Hereat, for example, in FIG. 9(c), if the fuse 272 and the low heat-conductive section 270 are to be fabricated from the same material, the fuse 272 and the low heat-conductive section 270 can be formed concurrently in one and the same step, which provides excellent productivity. Further, if the via plug 268 is to be fabricated from the same material as the fuse 272 and the low heat-conductive section 270, all of them can be formed concurrently together so that the productivity can be raised still further.

The horizontal type fuse 272 in a semiconductor device manufactured as described above can be blown by the irradiation of a laser beam L as shown in FIG. 9(c). In this instance, a part of the heat may dissipate, being conducted by way of a horizontal type fuse 272, through the first interconnection 271 and the second interconnection 273, both of which are connected with respective ends of the horizontal type fuse 272. However, since the interconnections connected with both ends of the fuse are connected with respective low heat-conductive sections, the heat dissipation can be well suppressed.

In practice, the irradiation of the laser beam is applied to the fuse 272, at least, through a passivation film which is omitted from the drawing. The film thickness of the passivation film is set to be preferably not less than 30 nm for protecting the interconnection from corrosion by the moisture or the like, but preferably not greater than 100 nm to achieve complete blowout of the fuse for certain. Further, according to the position where the fuse is formed, the irradiation of a laser beam may be applied to the fuse through the interconnection and the interlayer insulating film lying in the upper layer(s) with respect to the fuse. In any case, the fuse is preferably formed in the uppermost layer within the limits of possibility in order to enhance the irradiation accuracy of the laser beam and increase the blowout efficiency of the fuse by the laser beam.

Figure 11:
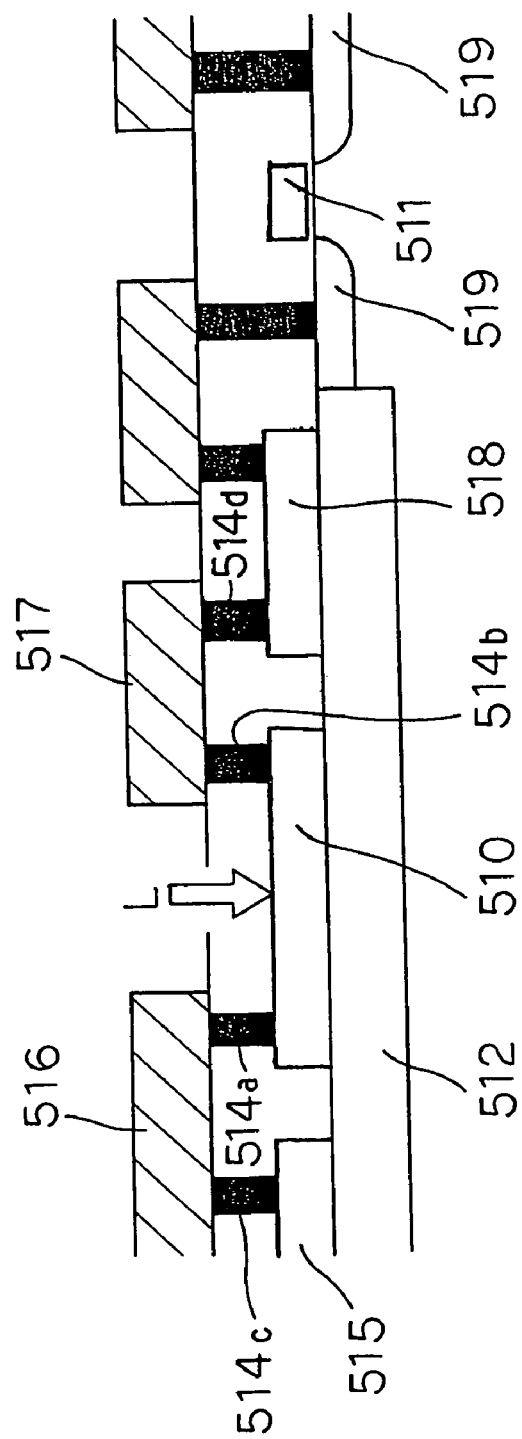
FIG. 11 is a schematic cross-sectional view showing a semiconductor device according to the present invention.

The structures in which the vertical type or horizontal type fuse is formed essentially in the upper layer interconnection layer are so far described. Next, FIG. 11 illustrates a structure in which a polyfuse is formed in a polycrystalline silicon layer which is laid immediately over an underlying transistor which comprises a gate electrode 511 and source/drain regions 519.

In this case, the structure comprises a fuse 510, a first low heat-conductive section 515 and a second heat-conductive section 518, all of which comprise polycrystalline silicon and are formed on an element isolation oxide film, and a first interconnection 516 and a second interconnection 517, both of which are formed in a first interconnection layer. Therein, a first contact plug 514a connects the fuse 510 to the first interconnection 516, while a second contact plug 514b connects the fuse 510 to the second interconnection 517. A third contact plug 514c connects the first low heat-conductive section 515 to the first interconnection, while a fourth contact plug 514d connects the second low heat-conductive section 518 to the second interconnection 517. Further, the first low heat-conductive section 515 is formed from a material with a heat conductivity lower than that of the first interconnection 516, and the second low heat-conductive section 518 is formed from a material with a heat conductivity lower than that of the second interconnection 517.

The polyfuse 510, the first low heat-conductive section 515 and the second low heat-conductive section 518 are polycides in which a silicide layer is formed on a polycrystalline silicon layer, and all of them are formed on an element isolation oxide film 512. These of the fuse and the low heat-conductive sections can be fabricated concurrently with the gate electrode 511. The polycrystalline silicon, hereat, can be doped polycrystalline silicon into which phosphorus is doped with a high concentration. Further, as a silicide, tungsten silicide, titanium silicide, cobalt silicide, molybdenum silicide, tantalum silicide, platinum silicide or the like may be utilized.

In this instance, polycrystalline silicon can provide a strong suppressing effect on the heat dissipation, due to its low heat conductivity. Further, since the fuse and the low heat-conductive sections can be fabricated together with the gate electrode, excellent productivity can be attained.

The blowout of the polyfuse 510 is made by applying the irradiation of the polyfuse 510 from the upper layer side with a laser beam L. Although some of the heat supplied by the laser beam L may be, by way of the polyfuse 510 and the contact plugs 514, conducted along the first interconnection 516 and the second interconnection 517 to the dissipation, the heat conduction further beyond the first low heat-conductive section 515 and the second low heat-conductive section 518 is well suppressed. As a result, the heat is stored at the laser beam irradiation site and the complete blowout of the polyfuse 510 can be satisfactorily achieved.

Hitherto, modes of the low heat-conductive sections with various structures are described. In actual circuits, it is preferable that dummy fuses serve as these low heat-conductive sections. When this sort of circuit network is employed, even when the amount of the heat dissipation is large and not only the fuse but also the low heat-conductive sections are blown, the semiconductor device can operate in good order.

Further, the present invention is applicable to a wide range of semiconductor devices in which a variety of cells may be disposed, which include volatile memories such as the DRAM (Dynamic Random Access Memory) and the SRAM (Static Random Access Memory); non-volatile memories such as the mask ROM (Read Only Memory), the EPROM (Erasable Programmable ROM), the EEPEOM (Electrically Erasable Programmable ROM) and the FLASH memory; and the logic.

What is claimed is:

1. A semiconductor device, comprising:
   a first wire having a first portion and a second portion different from said first portion, said first wire having a first heat conductivity;
   a fuse connected to said first portion of said first wire;
   said fuse having a second heat conductivity lower than said first heat conductivity;
   a first conductive portion connected to said second portion of said first wire, said first conductive portion having a third heat conductivity lower than said first heat conductivity;
   a second wire having a first part connected to said fuse; and
   a third wire connected to said first conductive portion.

2. The device as claimed in claim 1, said device further comprising:
   a second conductive portion connected to a second part of said second wire, and
   a fourth wire connected to said second conductive portion and having a fourth heat conductivity lower than said first heat conductivity.

3. The device as claimed in claim 2, wherein said first and fourth wires are formed at a first layer level and said second and third wires are formed on a second layer level.

4. The device as claimed in claim 2, wherein said first, second, third and fourth wires are formed at the same layer level.

5. The device as claimed in claim 1, wherein said first conductive portion has a plurality of through contact plugs.

6. The device as claimed in claim 1, said device further comprising a second conductive portion connected to a third portion of said wire, said third portion different from said first and second portions; and a fourth wire connected to said second conductive portion.

7. The device as claimed in claim 1, wherein said first, second and third wires are formed at the same layer level.

* * * * *